United States Patent [19]

Mitwalsky et al.

[11] Patent Number: 5,589,706

[45] Date of Patent: Dec. 31, 1996

[54] FUSE LINK STRUCTURES THROUGH THE ADDITION OF DUMMY STRUCTURES

[75] Inventors: Alexander Mitwalsky, Poughkeepsie, N.Y.; James G. Ryan, Newtown, Conn.

[73] Assignee: International Business Machines Corp., Armonk, N.Y.

[21] Appl. No.: 455,811

[22] Filed: May 31, 1995

[51] Int. Cl.$^6$ ...................... H01L 27/10
[52] U.S. Cl. ............ 257/529; 257/209; 437/60; 437/249; 437/922
[58] Field of Search .................. 257/529, 209; 437/60, 249, 922

[56] References Cited

U.S. PATENT DOCUMENTS

| | | |
|---|---|---|
| 3,959,047 | 5/1976 | Alberts et al. . |
| 4,853,758 | 8/1989 | Fischer . |
| 5,015,604 | 5/1991 | Lim et al. . |
| 5,017,510 | 5/1991 | Welch et al. . |
| 5,230,772 | 7/1993 | Kadomura . |
| 5,235,205 | 8/1993 | Lippitt, III ............... 257/528 |
| 5,264,387 | 11/1993 | Beyer et al. . |
| 5,278,105 | 1/1994 | Eden et al. . |
| 5,317,185 | 5/1994 | Fernandes et al. . |
| 5,420,455 | 5/1995 | Gilmour et al. ........... 257/529 |

FOREIGN PATENT DOCUMENTS

| | | |
|---|---|---|
| 3018024 | 1/1991 | Japan . |
| 4304633 | 10/1992 | Japan . |
| 5190502 | 7/1993 | Japan . |

OTHER PUBLICATIONS

Santini et al., "Method for Improving Plating Uniformity in Micron and Submicron Thin Film Devices" *IBM Technical Disclosure Bulletin* vol. 27 No. 3 Aug. 1984.

Cronin et al., "Minimum Groundrule, Electrically BLown Tungsten/Aluminum Fuse by Electromigration" *IBM Technical Disclosure Bulletin* vol. 31, No. 5 Oct. 1988.

Craig et al., "On–Chip Elctrically Programmable Fuse" *IBM Technical Disclosure Bulletin* vol. 29, No. 3, Aug. 1986.

*Primary Examiner*—Ngân V. Ngô
*Attorney, Agent, or Firm*—Whitham, Curtis, Whitham & McGinn; Alison D. Mortinger

[57] ABSTRACT

An improved etch behavior is promoted to generate vertical sidewalls for fuse links that will promote reliable and repeatable laser cutting of the fuse links. In one embodiment, dummy structures are added adjacent to fuse links in order to obtain the vertical sidewalls for reliable fuse deletion. The dummy structures form no part of the fuse or circuit structure but, because of the proximity of the dummy structures to the fuse links, vertical sidewalls are promoted in a reactive ion etch which is used to form the fuse array. In another embodiment, the vertical sidewalls of the fuse links are achieved in a damascene process in which grooves are formed in an oxide layer and filled with a metal. These grooves correspond to the fuse links and alternating dummy structures. Once filled, the surface is planarized using a chemical-mechanical process. The dummy structures provide reinforcement for the metallization (metal and dielectric film), maintaining the integrity of the metallization. In both embodiments, the vertical sidewalls and constant height of the resulting fuse links promote reliable laser cutting.

8 Claims, 2 Drawing Sheets

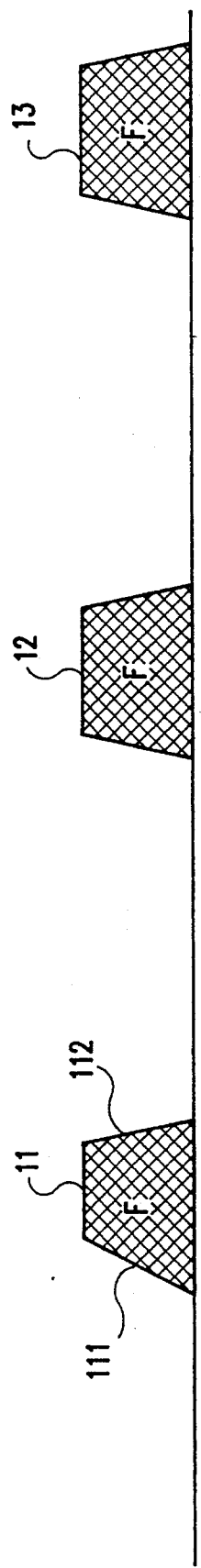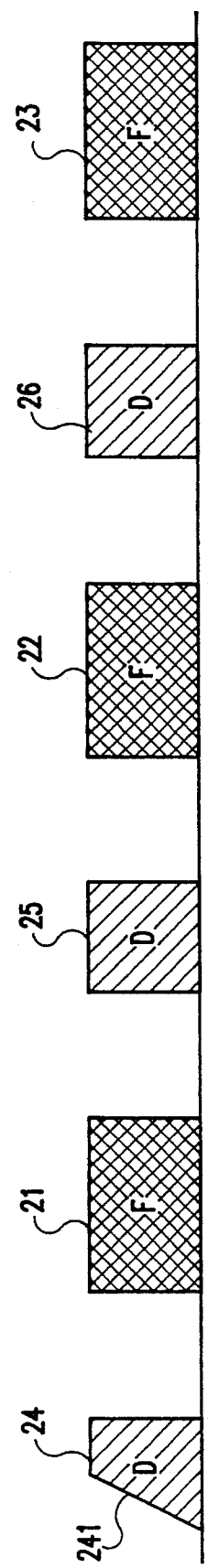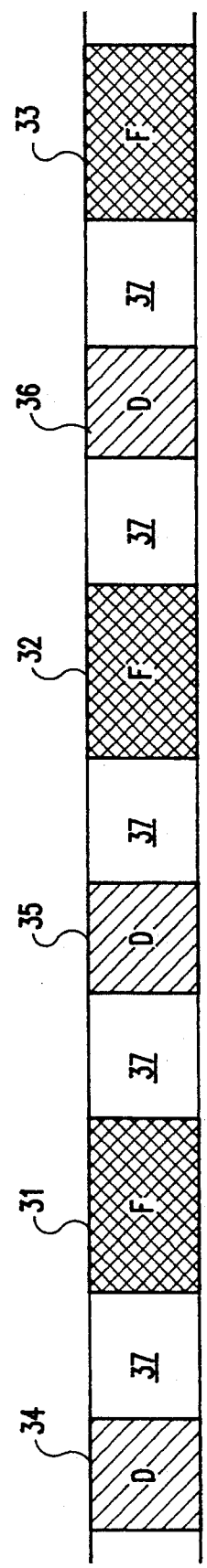

FUSE LINK STRUCTURES THROUGH THE ADDITION OF DUMMY STRUCTURES

BACKGROUND OF THE INVENTION

1. Field of the Invention

The present invention generally relates to fuse structures used in semiconductor technology for implementation of redundancy or custom wiring and, more particularly, to fuse structures having vertical fuse link sidewalls to promote reliable and reproducible laser cutting processes.

2. Background Description

Redundancy in integrated circuit memories is part of current chip manufacturing strategy to improve yield. By replacing defective cells with redundant circuits on chips, integrated circuit memory yields are significantly increased. The practice is to cut or blow conductive connects (fuses) which allow redundant memory cells to be used in place of nonfunctional cells. In the manufacture of integrated circuits, it is also common practice to provide for customization of chips and modules to adapt chips to specific applications. In this way, a single integrated circuit design may be economically manufactured and adapted to a variety of custom uses.

Typically, fuses or fusible links are incorporated in the integrated circuit design, and these fuses or fusible links are selectively blown, for example, by passing an electrical current of sufficient magnitude through them to cause them to open. For example, U.S. Pat. No. 3,959,047 to Alberts et al. discloses a metal fuse construction in the form of straight links which are "necked" to cause a high current concentration to heat and open the links. An on-chip programmable polysilicon fuse is described in *IBM Technical Disclosure Bulletin*, vol. 29, no. 3, August 1986, pp. 1291, 1292, and a tungsten/aluminum fuse blown by electromigration is described in *IBM Technical Disclosure Bulletin*, vol. 31, no. 5, October 1988, pp. 347, 348.

An alternative to blowing fuse links with a programmable high current is to use a laser to blow the fuses. For modern multi-level metallization integrated circuits (ICs), the opening of fuse windows with fuse links lying very close to the substrate (e.g., bit-line or Word-line) is of concern. The dielectric thickness on top of fuses suffers from non-uniformities caused by deposition, planarization and etch processes. As a result, a designer tries to raise the fuses to an upper metallization level to reduce the dielectric fuse etch distance. Usually, upper metallizations are patterned by reactive ion etch (RIE) which exhibits in many cases a microloading effect. Specifically, features created with small spacings possess vertical sidewalls while features with large spacings (such as fuses) have sloped sidewalls. This sidewall inclination, however, degrades the fuse deletion process via laser ablation since a significant portion of the laser energy is reflected by the sloped fuse sidewalls. In addition, the variation of the slope angle leads to varied laser absorption within the fuse resulting in an unstable fuse cut process.

Alternatively, metallization can be patterned by damascene process in which grooves with a certain pattern are first formed within a dielectric film. Thereafter, the metal is deposited and subsequently removed from the top of the dielectric film, using for example a chemical-mechanical polish. As a result, the metal remains only in the patterned grooves. However, for a low density of metal such as the fuse area, the removal of metal on top of the dielectric film might result in a reduction of metal stack height due to dishing and erosion. This, in turn, results in a variation in fuse height resulting in a lack of reliability of the fuse cutting process by laser.

SUMMARY OF THE INVENTION

It is therefore an object of the present invention to provide a scheme to generate vertical sidewalls for fuse links to promote reliable and repeatable laser cutting of the fuse links.

It is another object of the invention to provide a damascene process for fabricating fuse links that will maintain the integrity of the metallization (metal and dielectric film) at the fuse area.

According to the invention, dummy structures are added adjacent to fuse links. The dummy structures form no part of the fuse or circuit structure but serve to improve the quality of the fuse link structure produced. In one embodiment of the invention, the fuse links are formed by a reactive ion etch process. Because of the proximity of the dummy structures to the fuse links, vertical sidewalls are promoted in an RIE which is used to form the fuse array. This in turn promotes reliable fuse deletion by laser processes. In another embodiment, the vertical sidewalls of the fuse links are achieved in a damascene process in which grooves are formed in a dielectric film and filled with a metal. These grooves correspond to the fuse links and alternating dummy structures. Once filled, the metal is removed from the top of the dielectric film using, for example, a chemical-mechanical process. The dummy structures provide reinforcement of the fuse area, maintaining the integrity of the metallization. In both embodiments, the stabilized structure (sidewalls and dimensions) of the resulting fuse links promote reliable laser cutting.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a cross-sectional view of a portion of the fuse bank showing the sidewall inclination effect produced by RIE;

FIG. 3 is a cross-sectional view of a portion of the fuse bank with dummy structures added to improve etch behavior to obtain vertical fuse sidewalls according to a first embodiment of the invention; and FIG. 4 is a cross-sectional view of a portion of an alternate fuse bank with dummy structures formed using a damascene process employing a chemical-mechanical polish according to a second embodiment of the invention.

DETAILED DESCRIPTION OF A PREFERRED EMBODIMENT OF THE INVENTION

Figure 1:
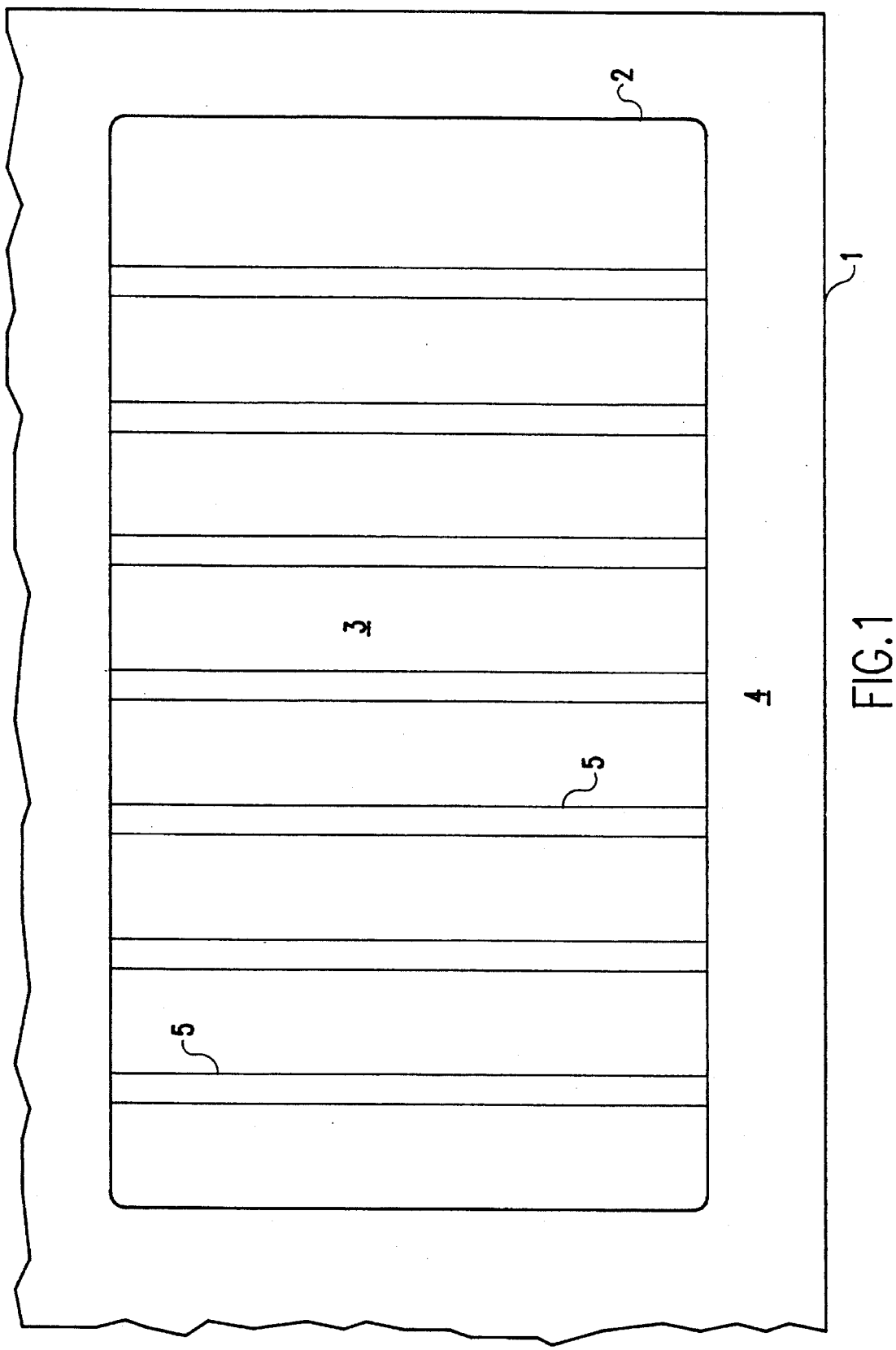
FIG. 1 is a plan view of an illustrative fuse bank within a window on an integrated circuit.

Referring now to the drawings, and more particularly to FIG. 1, there is shown a plan view of an area of a an integrated circuit 1 with window 2 formed to expose a fuse bank 3, preferably on an upper layer of metallization. The window is formed in a protective insulative layer 4 that overlies the integrated circuit. Exposing the fuse bank facilitates cutting of selected fuses by laser. The fuse bank shown is of simple geometry comprising an array of straight metal wires 5. This geometry, however, is merely illustrative, and other fuse shapes may be used including so-called "dog bone" fuse shapes.

FIG. 2 is a cross-sectional view of a portion of a fuse bank with one end of the array on the left hand side. The array of fuse links is formed by depositing a layer of metal on a dielectric film followed by a reactive ion etch (RIE). The metal is typically aluminum alloy, but other metals and alloys may be used. Only three fuse links 11, 12 and 13 are shown for the sake of simplicity of illustration. The fuse links are shown after formation by RIE and before a passivating layer is added to fill in the areas between the fuse links.

A fuse link, such as fuse link 11, at one edge of the array is characterized as having an outer (with respect to the array) sidewall 111 with a fairly acutely angled slope and an inner sidewall 112 with a less acutely angled slope. The intermediate fuse links 12 and 13 each have sidewalls with slopes approximating that of the sidewall 112. This phenomena is due to the microloading effect of the RIE process; that is, features with small spacings possess vertical sidewalls, but features with large spacings exhibit sloped sidewalls. Moreover, the slope is a function of the spacing between features, as indicated by the differences in the slopes of sidewalls 111 and 112. The problem is that the metals used, such as aluminum, are highly reflective, and the sloped sidewalls can result in unreliable cutting by a laser due to the reflections from the sidewalls rather than absorption in the metal of the laser energy.

According to a first embodiment of the present invention, dummy structures 24, 25 and 26 are inserted in the interstices of fuse links 21, 22 and 23. These dummy structures form no part of the fuse array or the underlying circuit and are essentially sacrificial structures used to promote vertical sidewalls in the fuse links 21, 22 and 23 in the RIE process. This can be seen in slope of the outer side wall 241 of the dummy structure 24. Note however that due to the relative close proximity of the dummy structures to adjacent fuse links 21, 22 and 23, the sidewalls of the fuse links are vertical. This improved etch behavior results in a fuse structure that exhibits reliable and reproducible fuse cut process.

According to a second embodiment of the invention, the fuse links 31, 32 and 33 and the intermediate dummy structures 34, 35 and 36 are formed in a layer of oxide 37 in a damascene process as shown in FIG. 4. In this process, grooves of the desired shape are formed in dielectric film 37, then filled with a metal by a deposition process. This is followed by planarizing the surface using, for example, a chemical-mechanical polish. Due to dishing and erosion during the planarization process, the metal stack height may suffer from a significant reduction. The dummy structures 34, 35 and 36 serve to reinforce the metallization, supporting it during the planarization process and thereby minimizing micro erosion and maintaining the planar integrity of the top of the metal pattern.

In both embodiments, the goal is the same; that is, to generate a stabilized structure (sidewall and dimension) of the fuse links so that the links may be reliably cut by laser. The dummy structures serve to help control the profiles of the fuse links during the manufacturing process.

While the invention has been described in terms of two preferred embodiments, those skilled in the art will recognize that the invention can be practiced with modification within the spirit and scope of the appended claims.

Having thus described our invention, what we claim as new and desire to secure by Letters Patent is as follows:

1. A fuse bank for an integrated circuit comprising:

an array of fuse links; and an interstitial array of dummy structures in close proximity of the fuse links so as to promote forming vertical sidewalls and constant height of the fuse links, whereby the fuse links may be reliably and reproducibly cut by laser.

2. The fuse bank as recited in claim 1 wherein the fuse links and dummy structures are formed in a reactive ion etch process, the proximity of the dummy structures to the fuse links serving to promote the generation of vertical sidewalls in the reactive ion etch process.

3. The fuse bank as recited in claim 1 wherein the fuse links and dummy structures are formed in a damascene process in which grooves are formed in a dielectric film and then filled by depositing a metal, the grooves defining vertical sidewalls in the fuse links, the dummy structures serving to reinforce the metal and dielectric film, during a planarization.

4. The fuse bank as recited in claim 1 wherein the fuse links are formed on an upper layer of a multilayer integrated circuit structure.

5. The fuse bank recited in claim 4 wherein the multilayer integrated circuit is provided with an overlying insulating layer and the fuse bank is exposed within a window in the overlying insulating layer.

6. A method of forming fuse bank for an integrated circuit comprisng an array of fuse links with vertical sidewalls so that the fuse links may be reliably and reproducibly cut laser, said method comprising the steps of:

defining said array of fuse links to be formed in the integrated circuit;

defining an interstitial array af dummy structures in close proximity to the fuse links; and forming the array of fuse links and the interstitial array of dummy structures in the integrated circuit.

7. The method recited in claim 6 wherein the step of forming the array of fuse links and the interstitial array of dummy structures is performed by a reactive ion etch process, the proximity of the dummy structures to the fuse links serving to promote the forming of vertical sidewalls in the fuse links in the reactive ion etch process.

8. The method recited in claim 6 wherein the step of forming the array of fuse links and the interstitial array of dummy structures is performed by a damascene process in which grooves are formed in an oxide layer and then filled by depositing a conductor, the grooves defining vertical sidewalls in the fuse links, the dummy structures serving to reinforce the metal during a planarization.

* * * * *

UNITED STATES PATENT AND TRADEMARK OFFICE
CERTIFICATE OF CORRECTION

PATENT NO. : 5,589,706
DATED : December 31, 1996
INVENTOR(S) : Mitwalsky, et al.

It is certified that error appears in the above-indentified patent and that said Letters Patent is hereby corrected as shown below:

**Claim 6, line 3, after "cut" insert --by--, and
line 7, after "array", delete "af" and insert therefor --of--**

Signed and Sealed this

Eighth Day of July, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.   : 5,589,706
DATED        : December 31, 1996
INVENTOR(S)  : Mitwalsky, et al.

It is certified that error appears in the above-indentified patent and that said Letters Patent is hereby corrected as shown below:

Title page, Item [73] Assignee:

Please correct the Assignees as follows:
 **International Business Machines Corporation, Armonk, N.Y.
 and Siemens Aktiengesellschaft, Munich, Fed Rep Germany**

Signed and Sealed this

Ninth Day of September, 1997

Attest:

BRUCE LEHMAN

Attesting Officer

Commissioner of Patents and Trademarks